United States Patent
Sonobe

[11] Patent Number: 5,193,053
[45] Date of Patent: Mar. 9, 1993

[54] PLASTIC PACKAGED SEMICONDUCTOR DEVICE

[75] Inventor: Kaoru Sonobe, Tokyo, Japan

[73] Assignee: NEC Corporation, Tokyo, Japan

[21] Appl. No.: 781,772

[22] Filed: Oct. 23, 1991

[30] Foreign Application Priority Data

Oct. 29, 1990 [JP] Japan .................. 2-291588

[51] Int. Cl.⁵ ........................... H05K 5/02
[52] U.S. Cl. ........................... 257/668; 361/400; 361/404; 361/405; 361/409; 361/421; 257/675; 257/676
[58] Field of Search ........ 361/400, 404, 405, 408, 361/409, 421; 357/68, 70, 72, 73; 174/52.2, 52.3, 52.4; 29/827, 855; 439/70

[56] References Cited

U.S. PATENT DOCUMENTS

| | | | |
|---|---|---|---|
| 4,115,837 | 9/1978 | Beall et al. | 361/488 |
| 4,340,902 | 7/1982 | Honda et al. | 357/74 |
| 4,483,067 | 11/1984 | Parmentier | 29/890 |
| 4,649,418 | 3/1987 | Uden | 357/80 |
| 4,758,927 | 7/1988 | Berg | 361/401 |

Primary Examiner—Leo P. Picard
Assistant Examiner—Young S. Whang
Attorney, Agent, or Firm—Laff, Whitesel, Conte & Saret

[57] ABSTRACT

A plastic semiconductor device has a lead frame provided with an island for received a semiconductor element. A plurality of leads project from a square outer frame and are distributed around the periphery of the island. An insulating substrate covers and is bonded to one principal surface of the island while exposing the semiconductor element. Distributing wires are formed on one principal surface of the insulating substrate to conform with the leads. A conductive substance connects the distributing wires to the leads and fills any through-holes formed in the insulating substrate. Bonding wires connect input-output terminals of the semiconductor element to the leads. A resin body encloses and embeds the bonding wires and the semiconductor element. A heat sink may be bonded to the back face of the island.

4 Claims, 3 Drawing Sheets

FIG. I(a)
PRIOR ART
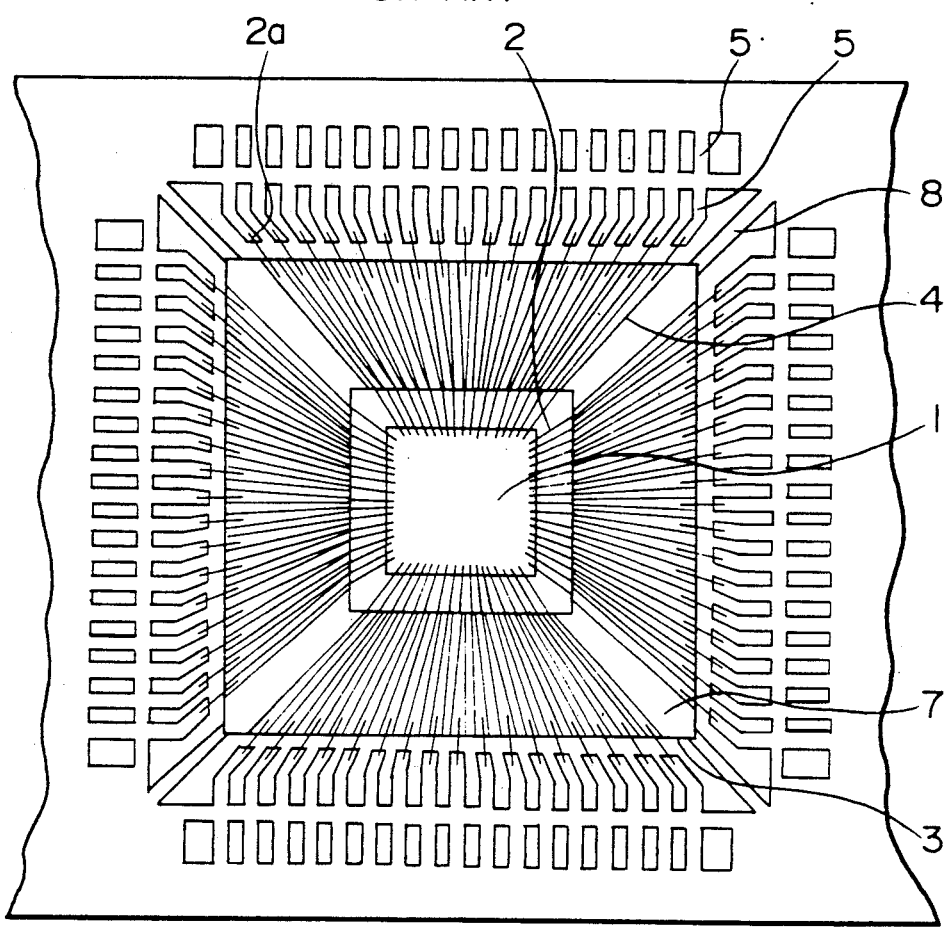
FIG. I(b)
PRIOR ART
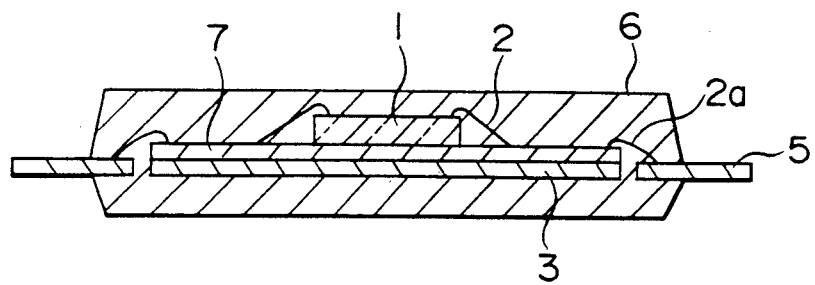

PLASTIC PACKAGED SEMICONDUCTOR DEVICE

BACKGROUND OF THE INVENTION (a) Field of the Invention

The present invention relates to a plastic packaged semiconductor device comprising a semiconductor element which is plastic-packaged or plastic-sealed.

(b) Description of the Prior Art

An example of the conventional plastic packaged semiconductor device is shown in FIGS. 1(a) and 1(b) as a plan view and a sectional view, respectively. For instance, the plastic packaged semiconductor device of this type comprises, as shown in FIGS. 1(a) and 1(b), a lead frame which comprises an island 3 supported by a rectangular-shaped outer frame through suspension leads 8 in the central portion thereof and a plurality of leads 5 extending from the outer frame and distributed around the periphery of the island 3; a substrate 7 which is bonded onto the island 3 through a silver paste and on which a plurality of distributing wires 4 radially arranged are formed; a semiconductor element 1 bonded onto the substrate 7; bonding wires 2 which connect the distributing wires 4 to input-output terminals of the semiconductor element 1; and bonding wires 2a which connect the distributing wires 4 of the substrate 7 to the leads 5. In addition, the semiconductor element 1 and the circumference thereof are enclosed and embedded in a resin body 6 for plastic-packaging to give a plastic packaged semiconductor device.

Such an assembling technique is likewise applicable to the production of composite type semiconductor devices, for instance, those in which a plurality of semiconductor devices are loaded on a substrate 7.

Recently, there has been advanced the development of small-sized and high speed-operating semiconductor devices equipped with multiple pins. However, it has been difficult to design these conventional plastic packaged semiconductor devices of this type so as to have a thickness as thin as possible and withstand a high operating power source.

For instance, as shown in FIG. 1(b), in the conventional plastic packaged semiconductor devices, a semiconductor element 1 is loaded onto a substrate 7 which is bonded to an island 3, distributing wires on the substrate are then wire-bonded to leads 5 and thereafter the assembly is plastic-packaged. For this reason, the thickness of the package is necessarily increased. Therefore, it is very difficult to reduce the thickness of such a package. In addition, if a substrate 7 formed from a glass-epoxy resin is employed, a semiconductor element having high consumed power cannot be loaded thereon because of the low heat radiation capacity of the glass-epoxy resin. Moreover, the substrate 7 is connected to the leads 5 of the lead frame through wire bonding in the conventional plastic packaged semiconductor devices and, therefore, the time for practicing the wire bonding operation is about two times that observed for semiconductor devices in which each electrode pad serving as input-output terminal of the seminconductor element is wire-bonded to a corresponding lead of a lead frame thereof.

SUMMARY OF THE INVENTION

Accordingly, the object of the present invention is generally to solve the foregoing problems associated with the conventional plastic packaged semiconductor devices and more specifically to provide a plastic packaged semiconductor device which has a reduced thickness and on which a semiconductor element having a high consumed power can be loaded.

According to an aspect of the present invention, there is provided a plastic packaged semiconductor device which comprises a lead frame provided with an island for loading a semiconductor element in the central part thereof and a plurality of leads which are projected from an outer frame having a square shape and distributed around the periphery of the island; an insulating substrate which covers one principal surface of the island and a part of the leads and is bonded thereto while exposing the semiconductor element; distributing wires which are formed on one principal surface of the insulating substrate so as to be in conformity with the leads; a conductive substance which connects the distributing wires to the leads and fills through-holes formed in the insulating substrate; bonding wires which connect input-output terminals of the semiconductor element to the leads; and a resin body which encloses and embeds the bonding wires and the semiconductor element.

According to another aspect of the present invention, there is provided a plastic packaged semiconductor device which further comprises a heat sink which is bonded to the back face of the island in addition to the foregoing components.

BRIEF DESCRIPTION OF THE DRAWINGS

FIGS. 1(a) and 1(b) are a plan view and a sectional view showing an embodiment of the conventional plastic packaged semiconductor device;

DESCRIPTION OF THE PREFERRED EMBODIMENTS

The plastic packaged semiconductor device according to the present invention will hereunder be described in more detail with reference to the accompanying drawings.

Figure 2A:
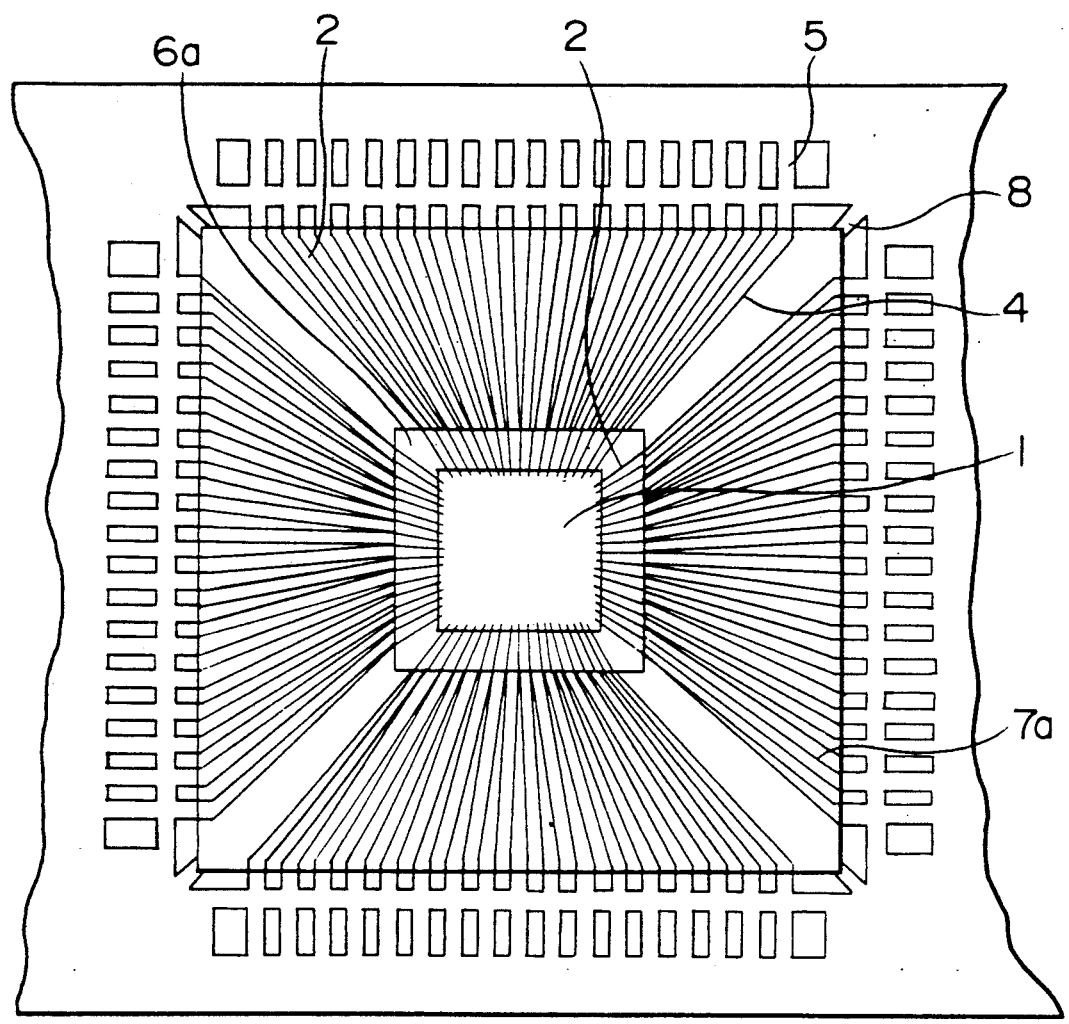
FIGS. 2(a) and 2(b) are a plan view and a sectional view of an embodiment of the plastic packaged semiconductor device according to the present invention, respectively.
Figure 2B:
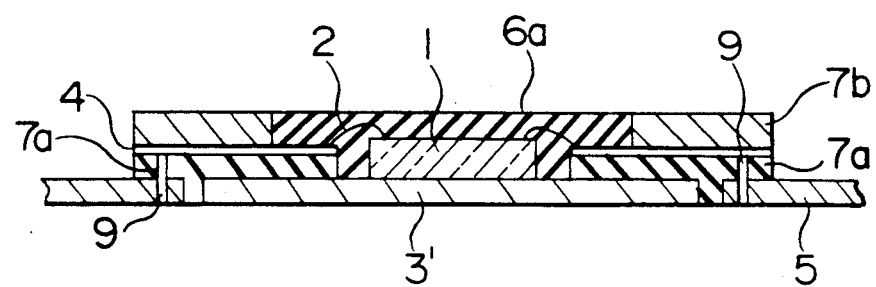

FIGS. 2(a) and 2(b) are a plan view and a sectional view of an embodiment of the plastic packaged semiconductor device according to the present invention, respectively. As shown in FIGS. 2(a) and 2(b), the plastic packaged semiconductor device is designed such that the size of a substrate 7a is greater than that of an island of a lead frame so that it also covers a part of leads 5 distributed around the periphery of the island and such that the substrate 7a has through-holes 9 having a shape and size sufficient for positioning a semiconductor element 1 therein whereby the element can be directly loaded on the island. Further, distributing wires 4 formed on the substrate 7a are connected to the leads 5 via through holes 9 which are subsequently filled with a conductive substance for electrically connecting the leads to the distributing wires. A frame 7b having, at the center, a hole of square shape which is geometrically similar to the semiconductor element 1 and greater than the size of the latter is fixed onto the substrate 7a through an adhesive and the space defined by the square holes of the frame and the substrate, the semiconductor element 1 and the island is filled with a resin to give a resin body 6a.

If the plastic packaged semiconductor device is designed so as to have such a structure, the number of operations for forming connections by bonding wires can be reduced to ½ time that required for the production of the conventional plastic packaged semiconductor devices. In the conventional plastic packaged semiconductor device, the semiconductor element 1 is loaded onto the substrate, while in the device of the present invention, the semiconductor element 1 is not directly bonded to the substrate, but to the island 3' of the lead frame made from a metal through an adhesive such as an Ag paste, as has already been explained above. For this reason, the radiation efficiency of heat generated by the element is greater than that achieved by the conventional devices and the thickness of the resulting package can be reduced by the thickness of the substrate. If it is, for instance, assumed that the thickness of the lead frame is 0.1 mm and that of the semiconductor element 1 is 0.35 mm, a semiconductor device having a thickness of 0.8 mm can be produced. Furthermore, after the semiconductor element 1 is wire-bonded, an epoxy resin is filled to a part of the surface of the printed substrate 7a through the potting technique to thus seal the semiconductor element. Thus, the quality of the device approximately identical to or superior to that of the conventional ones can be ensured.

Figure 3:
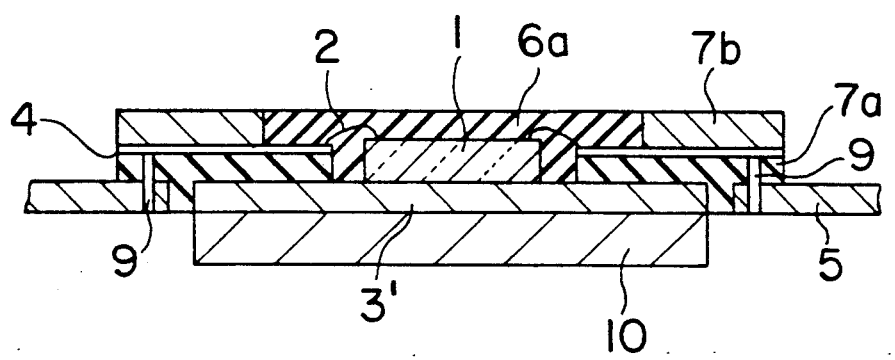
FIG. 3 is a sectional view of another embodiment of the plastic packaged semiconductor device according to the present invention.

FIG. 3 is a sectional view of another embodiment of the plastic packaged semiconductor device according to the present invention. This device has the same structure and components as those used in the foregoing embodiment except that, in the semiconductor device according to this embodiment, a heat sink 10 is bonded to the back face of the island 3' of the lead frame in the foregoing embodiment through the use of a highly heat-conductive silicone grease or the spot welding technique. The heat sink 10 is produced from a highly heat-conductive substance such as an aluminum sheet.

If the semiconductor device is designed to have the structure explained above, the thermal resistance of the package can be reduced by about 20% in the calm and about 50% at a wind velocity of 3 m/sec as compared with those for the foregoing embodiment and thus a semiconductor element 1 having a high consumed power can be loaded thereon. Alternatively, if the device is automatically assembled by the IR reflow technique, the assembling is performed such that the surface of the heat sink 10 is directed towards heat source whereby cracking of the plastic-packaging resin possibly observed when the device is exposed to a high temperature can surely be prevented.

As has been explained above in detail, in the plastic packaged semiconductor device according to the present invention, through holes formed in the substrate serve as means for connecting the distributing wires on the substrate to the leads of the lead frame, the semiconductor element is directly loaded onto one principal surface of the island of the lead frame to thus expose the back face of the island of the lead frame to the open air. This not only leads to an improvement of the heat radiation efficiency but also allows for the portion of the substrate to which the semiconductor element is bonded to neglect and hence the thickness of the semiconductor device can further be reduced. Further, the lead frame is electrically connected to the distributing wires formed on the printed substrate through the through-holes formed in the substrate and this makes it possible to reduce the number of wire bonding operations by half.

Thus, there can be produced, according to the present invention, a plastic packaged semiconductor device which is not expensive, has a substantially reduced thickness and may have a semiconductor element having a high consumed power built-in.

What is claimed is:

1. A plastic packaged semiconductor device comprising a lead frame provided with an island for loading a semiconductor element in the central part thereof and a plurality of leads which are projected from an outer frame having a square shape and distributed around the periphery of the island; an insulating substrate which covers one principal surface of the island and a part of the leads and is bonded thereto while exposing the semiconductor element; distributing wires which are formed on one principal surface of the insulating substrate so as to be in conformity with the leads; a conductive substance which connects the distributing wires to the leads and fills through-holes formed in the insulating substrate; bonding wires which connect input-output terminals of the semiconductor element to the leads; and a resin body which encloses and embeds the bonding wires and the semiconductor element.

2. The plastic packaged semiconductor device according to claim 1 wherein it further comprises a heat sink bonded to the back face of the island.

3. The plastic packaged semiconductor device according to claim 1 wherein the size of the substrate is greater than that of an island of a lead frame so that it covers a part of leads distributed around the periphery of the island.

4. The plastic packaged semiconductor device according to claim 1 wherein the outer frame has a hole of square shape which is geometrically similar to and greater than the semiconductor element, and is fixed onto the substrate.

* * * * *